(12) United States Patent
Tang et al.

(10) Patent No.: US 8,897,034 B2
(45) Date of Patent: Nov. 25, 2014

(54) SPLITTER PLATE AND ELECTRONIC APPARATUS

(75) Inventors: Yinzhong Tang, Shenzhen (CN); Guangjing Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 190 days.

(21) Appl. No.: 13/531,950

(22) Filed: Jun. 25, 2012

(65) Prior Publication Data

US 2012/0262859 A1 Oct. 18, 2012

Related U.S. Application Data

(63) Continuation of application No. PCT/CN2011/071187, filed on Feb. 23, 2011.

(30) Foreign Application Priority Data

Mar. 18, 2010 (CN) .......................... 2010 1 0129148

(51) Int. Cl.
*H05K 7/02* (2006.01)
*H05K 7/12* (2006.01)
*H05K 7/14* (2006.01)

(52) U.S. Cl.
CPC .................................. *H05K 7/1418* (2013.01)
USPC ....................................................... 361/808

(58) Field of Classification Search
CPC ........... H05K 7/02; H05K 7/12; H05K 1/182; H05K 7/06; H05K 7/1023

USPC .................................................... 361/679, 808
See application file for complete search history.

(56) References Cited

U.S. PATENT DOCUMENTS

| 5,483,419 | A | * | 1/1996 | Kaczeus et al. | .......... 361/679.39 |
| 5,557,499 | A | * | 9/1996 | Reiter et al. | ............. 361/679.39 |
| 5,587,877 | A | * | 12/1996 | Ryan et al. | .................. 361/679.6 |
| 5,777,845 | A | * | 7/1998 | Krum et al. | ............... 361/679.34 |
| 7,580,253 | B1 | * | 8/2009 | Chen et al. | ................ 361/679.33 |

FOREIGN PATENT DOCUMENTS

| CN | 2294550 Y | 10/1998 |
| CN | 201319712 Y | 9/2009 |
| CN | 201383121 Y | 1/2010 |
| CN | 101790295 A | 7/2010 |

OTHER PUBLICATIONS

English language International Search Report from the State Intellectual Property Office of P.R. China for International Application No. PCT/CN2011/071187 mailed Jun. 2, 2011.

* cited by examiner

*Primary Examiner* — Jenny L Wagner
*Assistant Examiner* — Michael P McFadden

(57) ABSTRACT

The present invention discloses a splitter plate and an electronic apparatus. The splitter plate includes a splitter plate main body, and further includes a turnover positioning apparatus, and the turnover positioning apparatus is hinged on a side of the splitter plate main body; the turnover positioning apparatus is configured to, after a half-height board is assembled to a subrack, abut against the half-height board and connect to the subrack to fasten the half-height board to the subrack.

13 Claims, 4 Drawing Sheets

SPLITTER PLATE AND ELECTRONIC APPARATUS

CROSS-REFERENCE TO RELATED APPLICATIONS

This application is a continuation of International Application No. PCT/CN2011/071187, filed on Feb. 23, 2011, which claims priority to Chinese Patent Application No. 201010129148.7, filed on Mar. 18, 2010, both of which are hereby incorporated by reference in their entireties.

FIELD OF THE INVENTION

The present invention relates to a telecommunications technology field, and in particular, to a splitter plate and an electronic apparatus including a splitter plate.

BACKGROUND OF THE INVENTION

The micro telecommunications computing architecture (micro telecommunications computing architecture, referred to as MTCA hereinafter) is an industrial standard that applies to communications devices. A computer device based on the MTCA standard has the advantages of a compact structure and layout, low power consumption and a small occupied space, and excellent scalability, popularity and interchangeability. A subrack of the computer device based on the MTCA standard is used to install boards, and the boards generally include a circuit board, a front panel fixed on the circuit board, and an electronic component connected to a connector of the circuit board. The boards are classified to a full-height board and a half-height board based on the installation size. The full-height board is directly inserted into an upper chute and a lower chute, and is electrically connected to the subrack through the connector; the half-height board is assembled to the subrack through a splitter plate that is with a chute in the middle and is set in the subrack.

The following method is generally used to assemble the half-height board to the subrack: The splitter plate is set in the subrack and is located at one side of a surface that is formed by the upper chute and the lower chute. In the middle of the splitter plate, an upper supporting chute corresponding to the upper chute and a lower supporting chute corresponding to the lower chute are set; the upper supporting chute, the lower supporting chute, the upper chute, and the lower chute have the same structure; a raised barb is set at entries of the chutes so that the barb coordinates with a locking spring plate set on a handle of the half-height board to fix the half-height board to the subrack.

After the half-height board is assembled to the subrack through the splitter plate, because the half-height board is fixed to the subrack only through the locking spring plate and the barb, the half-height board is not securely fixed, and it is possible that the assembled half-height board sways, and therefore the connector of the half-height board is not well connected to the connector of the subrack. Therefore, the connection between the half-height board and the subrack is not reliable.

SUMMARY OF THE INVENTION

Embodiments of the present invention provide a splitter plate and an electronic apparatus to solve the problem that a half-height board is not securely fixed and a connector of the half-height board is not well connected to a connector of a subrack, and to improve reliability of the connection between the half-height board and the subrack.

An embodiment of the present invention provides a splitter plate, including a splitter plate main body and a turnover positioning apparatus. The turnover positioning apparatus is hinged on a side of the splitter plate main body; the turnover positioning apparatus is configured to, after a half-height board is assembled to a subrack, abut against the half-height board and connect to the subrack to fasten the half-height board to the subrack.

An embodiment of the present invention provides an electronic apparatus, including a subrack, a half-height board, and a splitter plate; the splitter plate includes a splitter plate main body, and the splitter plate main body is set in the subrack; the splitter plate further includes a turnover positioning apparatus, and the turnover positioning apparatus is hinged on a side of the splitter plate main body; the turnover positioning apparatus is configured to, after the half-height board is assembled to the subrack, abut against the half-height board and connect to the subrack to fasten the half-height board to the subrack.

In the splitter plate and the electronic apparatus according to the embodiments of the present invention, the turnover positioning apparatus is hinged on the side of the splitter plate main body; after the half-height board is assembled to the subrack, the turnover positioning apparatus abuts against the half-height board and connects to the subrack, so that the turnover positioning apparatus fastens the half-height board to the subrack securely to ensure that a connector of the half-height board is well connected to a connector of the subrack, thus improving reliability of the connection between the half-height board and the subrack.

BRIEF DESCRIPTION OF THE DRAWINGS

To describe the technical solutions of the embodiments of the present invention or the prior art more clearly, accompanying drawings required for describing the embodiments or the prior art are briefly introduced below. Apparently, the accompanying drawings in the following description are merely some embodiments of the present invention, and those of ordinary skill in the art may further obtain other drawings according to these accompanying drawings without making creative efforts.

DETAILED DESCRIPTION OF THE EMBODIMENTS

To make the objectives, technical solutions, and advantages of the present invention clearer, the technical solutions of the embodiments of the present invention are described clearly and completely below in conjunction with the accompanying drawings in the embodiments of the present invention. Apparently, the embodiments to be described are merely part of rather than all of the embodiments of the present invention. All other embodiments obtained by those of ordinary skill in the art without making creative efforts based on the embodiments of the present invention shall fall within the scope of the present invention.

Embodiment 1

Figure 1:
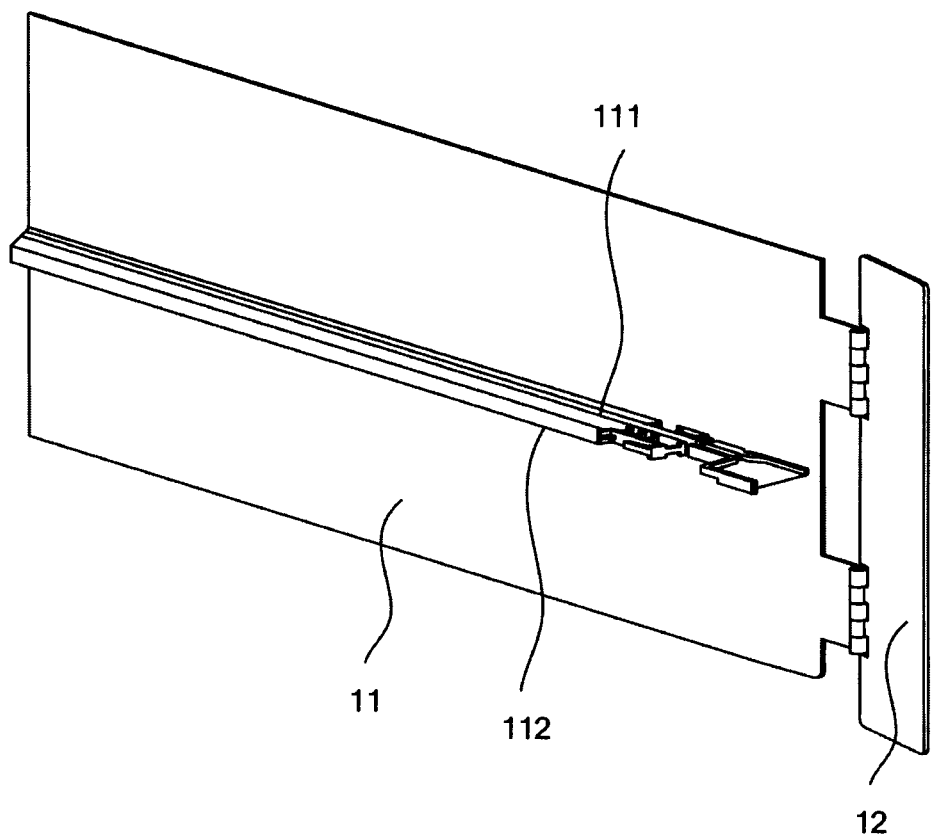
FIG. 1 is a schematic structural diagram of a splitter plate according to a first embodiment of the present invention.

FIG. 1 is a schematic structural diagram of a splitter plate according to a first embodiment of the present invention. As shown in FIG. 1, the splitter plate according to this embodiment includes a splitter plate main body 11 and also includes a turnover positioning apparatus 12.

The turnover positioning apparatus 12 is hinged on a side of the splitter plate main body 11; the turnover positioning apparatus 12 is configured to, after a half-height board is assembled to a subrack, abut against the half-height board and connect to the subrack to fasten the half-height board to the subrack.

Specifically, when the half-height board needs to be assembled to the subrack, the splitter plate according to this embodiment is assembled to the subrack first, so that an upper supporting chute 111 in the splitter plate according to this embodiment corresponds to an upper chute in the subrack, and a lower supporting chute 112 in the splitter plate according to this embodiment corresponds to a lower chute in the subrack. Then, the half-height board is assembled to the subrack through the splitter plate according to this embodiment. In this embodiment, an example that the half-height board is set in the lower supporting chute 112 and the lower chute in the subrack is taken to describe the splitter plate. When the half-height board is inserted into the lower supporting chute 112 and the lower chute in the subrack and after a connector of the half-height board is connected to a connector of the subrack, in order to fasten the half-height board to the subrack securely and ensure good connection between the connector of the half-height board and the connector of the subrack, the turnover positioning apparatus 12 in the splitter plate 12 abuts against the half-height board that is assembled in the subrack and connect to the subrack. At this time, the turnover positioning apparatus 12 brings certain pressure to bear on the half-height board to ensure that the connector of the half-height board is in good connection with the connector of the subrack; the turnover positioning apparatus 12 also fixes the half-height board to the lower supporting chute 112 and the lower chute of the subrack. Even if the subrack vibrates due to external factors, the half-height board can also be fastened by the turnover positioning apparatus 12 to the subrack securely, thus reducing the effect of vibration of the subrack on the half-height board. The turnover positioning apparatus 12 according to this embodiment may be connected to the subrack through connection components such as clasp or screw; the connection manner between the turnover positioning apparatus 12 in the splitter plate according to this embodiment and the subrack is not limited in this embodiment.

In the splitter plate according to this embodiment of the present invention, the turnover positioning apparatus is hinged on the side of the splitter plate main body; after the half-height board is assembled to the subrack, the turnover positioning apparatus abuts against the half-height board and connects to the subrack, so that the turnover positioning apparatus fastens the half-height board to the subrack securely to ensure that the connector of the half-height board is in good connection with the connector of the subrack, thus improving reliability of the connection between the half-height board and the subrack.

Embodiment 2

Figure 2:
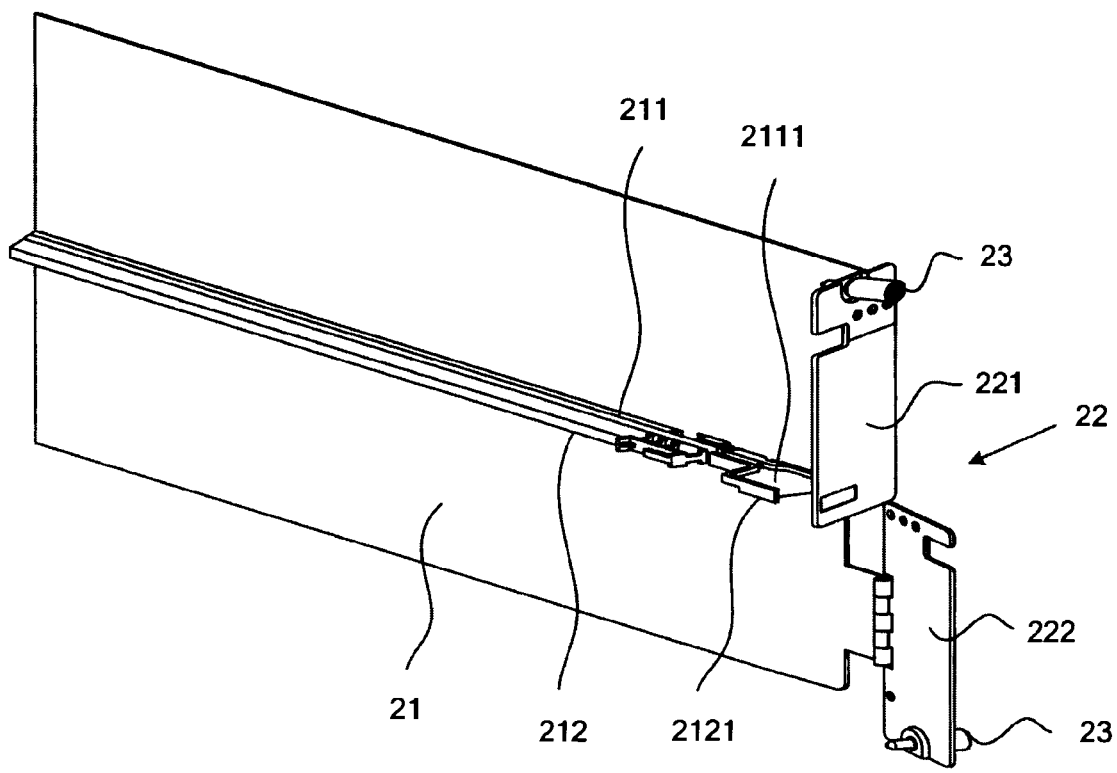
FIG. 2 is a schematic structural diagram of a splitter plate according to a second embodiment of the present invention.

FIG. 2 is a schematic structural diagram of a splitter plate according to a second embodiment of the present invention.

As shown in FIG. 2, the splitter plate according to this embodiment is based on the splitter plate according to the first embodiment and differs in that: A turnover positioning apparatus 22 according to this embodiment further includes a lock-up apparatus 23, and the lock-up apparatus 23 is set on the turnover positioning apparatus 22; the lock-up apparatus 23 is configured to connect the turnover positioning apparatus 22 to the subrack after the turnover positioning apparatus 22 abuts against the half-height board.

Specifically, the turnover positioning apparatus 22 in the splitter plate according to this embodiment needs to be connected to the subrack to fasten the half-height board securely. To conveniently connect the turnover positioning apparatus 22 to the subrack securely, the turnover positioning apparatus 22 according to this embodiment is securely connected to the subrack through the lock-up apparatus 23. Specifically, after the half-height board is assembled to the subrack, turn the turnover positioning apparatus 22 to make the turnover positioning apparatus 22 abut against the half-height board; then, use the lock-up apparatus 23 to securely connect the turnover positioning apparatus 22 to the subrack, thus finally fastening the half-height board to the subrack.

In the splitter plate according to this embodiment, the lock-up apparatus is set on the turnover positioning apparatus, so that the turnover positioning apparatus may be conveniently connected to the subrack securely through the lock-up apparatus, thus ensuring that the turnover positioning apparatus can securely fasten the half-height board to the subrack, and improving reliability of the connection between the half-height board and the subrack.

Based on the foregoing technical solution, optionally, the turnover positioning apparatus 22 according to this embodiment is a turnover plate, and a side of the turnover plate is hinged on a side of a splitter plate main body 21; the lock-up apparatus 23 is a screw; the screw is installed in a through hole (not shown in the figure) opened in the turnover plate and configured to connect to a threaded hole that is correspondingly set in the subrack.

Specifically, in order to conveniently implement functions of the turnover positioning apparatus 22 and the lock-up apparatus 23 according to this embodiment, the turnover positioning apparatus 22 according to this embodiment may be a turnover plate. A side of the turnover plate is hinged on a side of the splitter plate main body 21 so that the turnover plate can turn relative to the splitter plate main body 21. Besides, the lock-up apparatus 23 according to this embodiment is a screw, and the screw is installed in the through hole set in the turnover plate. When the half-height board assembled to the subrack needs to be fastened by the turnover positioning apparatus 22, first turn the turnover plate so that the turnover plate abuts against the half-height board, and then, connect the screw to the threaded hole opened in the subrack to fasten the turnover plate to the subrack.

Further, the turnover plate according to this embodiment includes an upper turnover plate 221 and a lower turnover plate 222; a side of the upper turnover plate 221 and a side of the lower turnover plate 222 are respectively hinged on a side of the splitter plate main body 21; a through hole opened on the top of the upper turnover plate 221 is installed with a screw, and a through hole opened on the bottom of the lower turnover plate 222 is installed with a screw. Specifically, by setting the turnover plate as the upper turnover plate 221 and the lower turnover plate 222, half-height boards in different locations can be fixed respectively through the upper turnover plate 221 and the lower turnover plate 222. For example, two half-height boards are assembled to the subrack by using the splitter plate according to this embodiment. When an upper half-height board needs to be repaired or replaced, it is only required to loosen the screw on the upper turnover plate 221 to repair or replace the half-height board, thus effects on the other half-height board that works normally are effectively reduced when the half-height board is being repaired or replaced.

In the splitter plate according to this embodiment, the turnover plate is used as the turnover positioning apparatus to conveniently implement functions of the turnover positioning apparatus; the screw is used as the lock-up apparatus to conveniently implement functions of the lock-up apparatus. Besides, by dividing the turnover plate to the upper turnover plate and the lower turnover plate, half-height boards in different heights are fixed respectively by using the upper turnover plate and the lower turnover plate, so that assembling of respective half-height boards are not affected, and reliability between the connections between half-height boards and the subrack is improved.

Based on the foregoing technical solution, optionally, the splitter plate main body 21 according to this embodiment is set with an upper supporting chute 211 and a lower supporting chute 212, and an entry 2111 of the upper supporting chute 211 is a smooth chute with a horn-shape structure; an entry 2121 of the lower supporting chute 212 on the splitter plate main body 21 is a smooth chute with a horn-shape structure.

Specifically, the splitter plate according to this embodiment uses the turnover positioning apparatus 22 to fasten the half-height boards assembled to the subrack, and therefore, there is no need to add a barb at an entry of a chute. Besides, by setting the entry 2111 of the upper supporting chute 211 to a smooth chute with a horn-shape structure, and similarly, by setting the entry 2121 of the lower supporting chute 212 to a smooth chute with a horn-shape structure, users can easily insert the half-height boards to the chutes when assembling the half-height boards to the subrack.

In the splitter plate according to this embodiment, entries of the upper supporting chute and the lower supporting chute on the splitter plate main body are set to smooth chutes with a horn-shape structure so that users can easily insert the half-height boards to the chutes, which makes the assembling process of the half-height boards easier.

Figure 3:
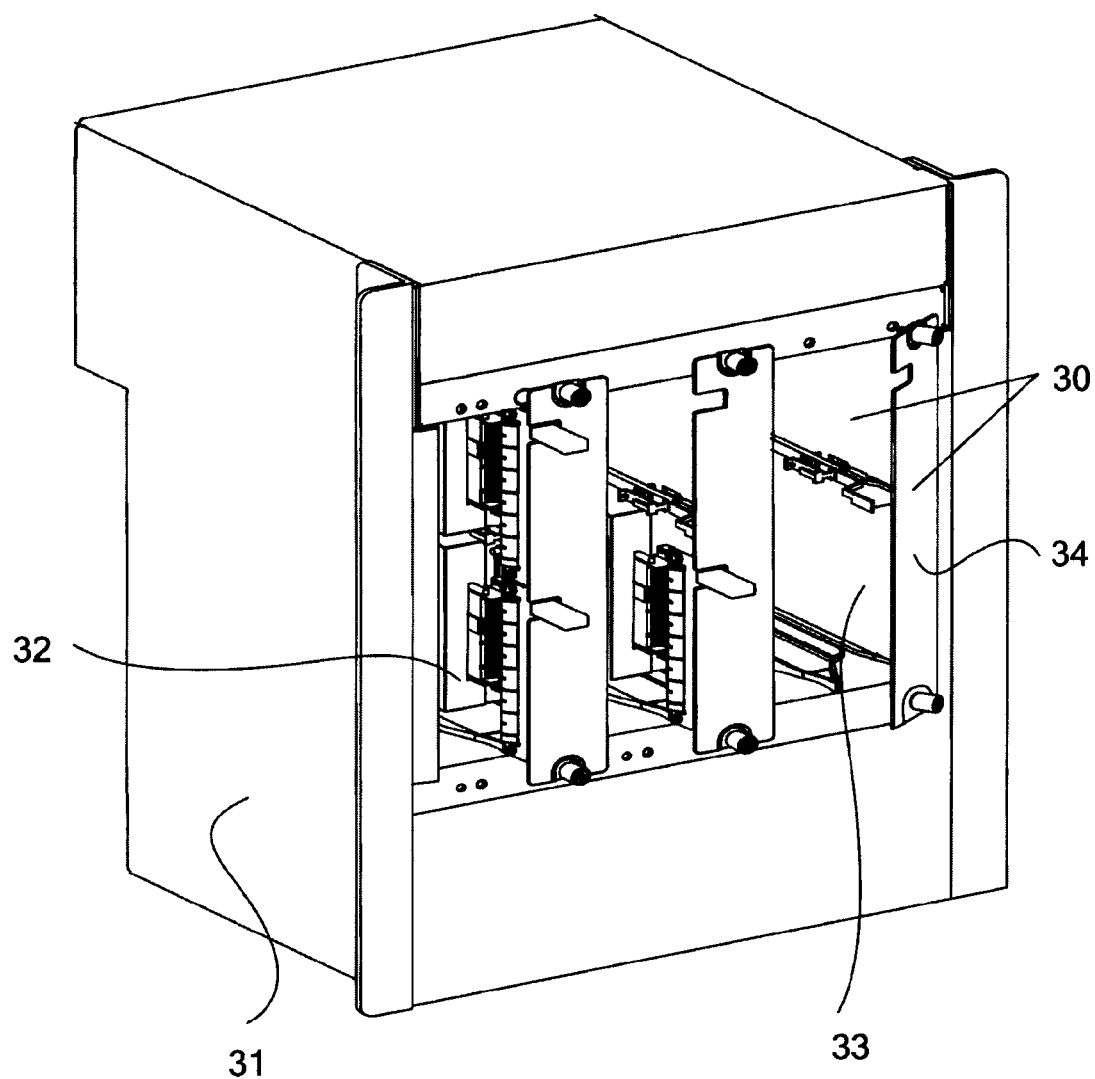
FIG. 3 is a schematic structural diagram of an electronic apparatus according to a third embodiment of the present invention.

FIG. 3 is a schematic structural diagram of an electronic apparatus according to a third embodiment of the present invention. As shown in FIG. 3, the electronic apparatus according to this embodiment includes a subrack 31, a half-height board 32, and a splitter plate 30; the splitter plate 30 includes a splitter plate main body 33, and the splitter plate main body 33 is set in the subrack 31; the splitter plate 30 further includes a turnover positioning apparatus 34, and the turnover positioning apparatus 34 is hinged on a side of the splitter plate main body 33; the turnover positioning apparatus 34 is configured to, after the half-height board 32 is assembled to the subrack 31, abut against the half-height board 32 and connect to the subrack 31 to fasten the half-height board 32 to the subrack 31.

Specifically, a full-height board (not shown in the figure) or the half-height board 32 may be assembled to the subrack 31 in the electronic apparatus according to this embodiment. When the half-height board 32 needs to be assembled to the subrack 31, the splitter plate 30 is used to assemble the half-height board 32 to the subrack 31. The splitter plate 30 according to this embodiment further includes the splitter plate main body 33 and the turnover positioning apparatus 34, and the turnover positioning apparatus 34 is hinged on the splitter plate main body 33, so that the turnover positioning apparatus 34 can turn relative to the splitter plate main body 33. When the half-height board 32 needs to be assembled to the subrack 31, first, the splitter plate is set in the subrack 31, where an upper supporting chute on the splitter plate main body 33 corresponds to an upper chute on the subrack 31, and a lower supporting chute corresponds to a lower chute; then, the half-height board 32 may be assembled to the subrack 31 through the upper supporting chute and the upper chute or the lower supporting chute and the lower chute; finally, the turnover positioning apparatus 34 rotates around the splitter plate main body 33 to make the turnover positioning apparatus 34 abut against the half-height board 32 and connect the turnover positioning apparatus 34 to the subrack 31. At this time, the turnover positioning apparatus 34 brings certain pressure to bear on the half-height board 32 to ensure that a connector of the half-height board 32 is in good connection with a connector of the subrack 31; the turnover positioning apparatus 34 also fixes the half-height board 32 to the subrack 31. Even if the subrack 31 vibrates due to external factors, the half-height board 32 can also be fastened by the turnover positioning apparatus 34 to the subrack 31 securely, thus reducing the effect of vibration of the subrack 31 on the half-height board 32.

In the electronic apparatus according to this embodiment, the turnover positioning apparatus is hinged on the side of the splitter board main body; after the half-height board is assembled to the subrack, the turnover positioning apparatus abuts against the half-height board and connects to the subrack, so that the turnover positioning apparatus fastens the half-height board to the subrack securely to ensure that the connector of the half-height board is in good connection with the connector of the subrack, thus improving reliability of the connection between the half-height board and the subrack, and enabling the electronic apparatus according to this embodiment operate more reliably.

Embodiment 4

Figure 4:
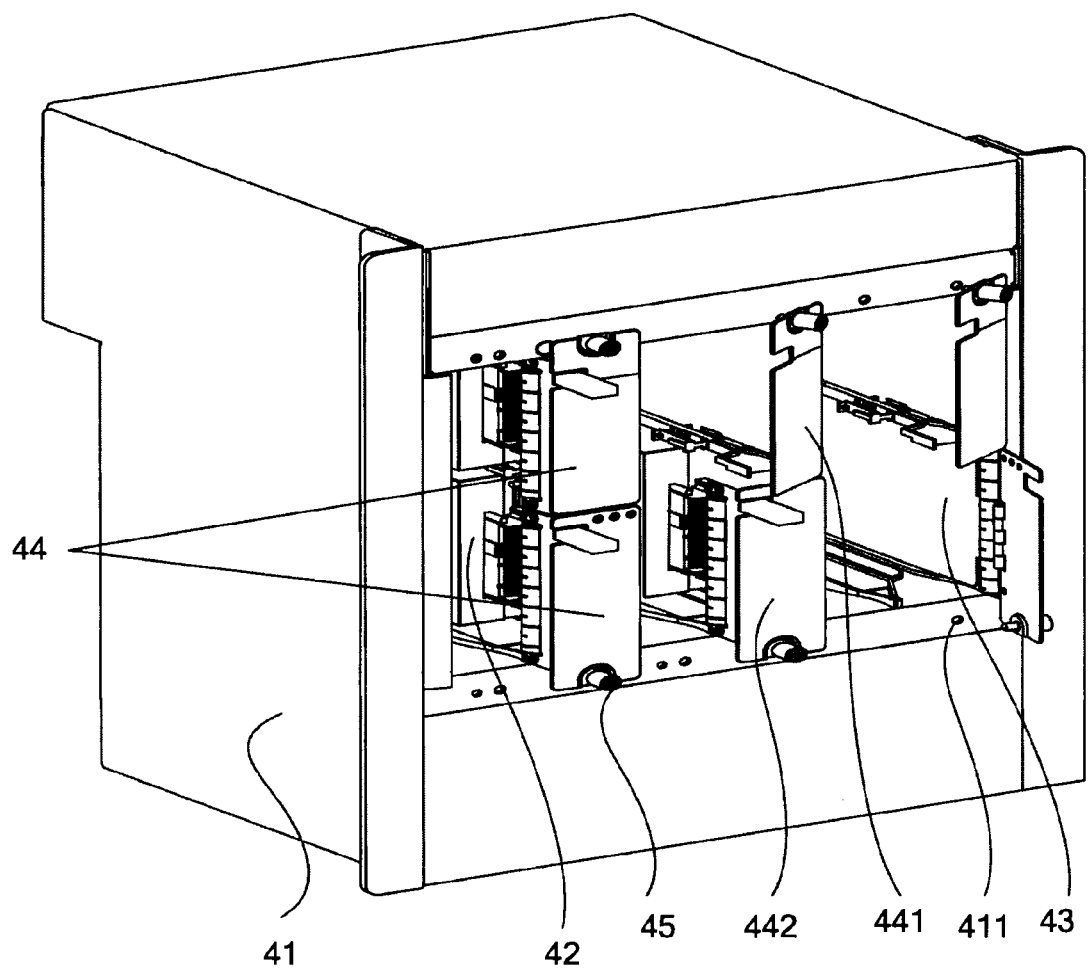
FIG. 4 is a schematic structural diagram of an electronic apparatus according to a fourth embodiment of the present invention.

FIG. 4 is a schematic structural diagram of an electronic apparatus according to a fourth embodiment of the present invention. As shown in FIG. 4, the electronic apparatus according to this embodiment is based on the electronic apparatus according to the third embodiment and differs in that: A turnover positioning apparatus 44 according to this embodiment further includes a lock-up apparatus 45, and the lock-up apparatus 45 is set on the turnover positioning apparatus 44; the lock-up apparatus 45 is configured to connect the turnover positioning apparatus 44 to a subrack 41 after the turnover positioning apparatus 44 abuts against a half-height board 42.

Specifically, the turnover positioning apparatus in the electronic apparatus according to this embodiment needs to be connected to the subrack 41 to fasten the half-height board 42 securely. To conveniently connect the turnover positioning apparatus 44 to the subrack 31 securely, the turnover positioning apparatus 44 according to this embodiment is fixedly connected to the subrack 41 through the lock-up apparatus 45. Specifically, after the half-height board 42 is assembled to the subrack 41, turn the turnover positioning apparatus 44 to make the turnover positioning apparatus 44 abut against the half-height board 42; then, use the lock-up apparatus 45 to fixedly connect the turnover positioning apparatus 44 to the subrack 41, finally fasten the half-height board 42 to the subrack 41 securely. Meanwhile, because the turnover positioning apparatus 44 is fixedly connected to the subrack 41 through the lock-up apparatus 45, the lock-up apparatus 45 may fix the splitter plate to the subrack 41 more securely, which enables respective components of the electronic apparatus according to this embodiment to be assembled more securely, and makes the entire structure of the electronic apparatus according to this embodiment more secure.

In the electronic apparatus according to this embodiment, the lock-up apparatus is set on the turnover positioning apparatus, so that the turnover positioning apparatus may be conveniently connected to the subrack securely through the lock-up apparatus, thus ensuring that the turnover positioning apparatus can securely fasten the half-height board to the subrack, and improving reliability of the connection between the half-height board and the subrack.

Based on the foregoing technical solution, optionally, the turnover positioning apparatus 44 according to this embodiment is a turnover plate, and a side of the turnover plate is hinged on a side of the splitter plate main body 43; the lock-up apparatus 45 is a screw; the screw is installed in a through hole (not shown in the figure) opened in the turnover plate and configured to connect a threaded hole 411 that is correspondingly set in the subrack 41.

Specifically, to conveniently implement functions of the turnover positioning apparatus 44 and the lock-up apparatus 45 according to this embodiment, the turnover positioning apparatus 44 according to this embodiment may be a turnover plate. A side of the turnover plate is hinged on a side of the splitter plate main body 43 so that the turnover plate can turn relative to the splitter plate main body 43. Besides, the lock-up apparatus 45 according to this embodiment is a screw, and the screw is installed in the through hole opened in the turnover plate. When the half-height board 42 assembled to the subrack 41 needs to be fastened by the turnover positioning apparatus 45, first turn the turnover plate so that the turnover plate abuts against the half-height board 42, and then, connect the screw to the threaded hole 411 opened in the subrack 41 to make the turnover plate be fastened to the subrack 41.

Further, the turnover plate according to this embodiment includes an upper turnover plate 441 and a lower turnover plate 442; a side of the upper turnover plate 441 and a side of the lower turnover plate 442 are respectively hinged on a side of the splitter plate main body 43; a through hole opened on the top of the upper turnover plate 441 is installed with a screw, and a through hole opened on the bottom of the lower turnover plate 442 is installed with a screw. Specifically, by setting the turnover plate as the upper turnover plate 441 and the lower turnover plate 442, half-height boards 42 in different locations can be fixed respectively through the upper turnover plate 441 and the lower turnover plate 442. For example, two half-height boards 42 are assembled to the subrack 41 of the electronic apparatus according to this embodiment. When a lower half-height board 42 needs to be repaired or replaced, it is only required to loosen the screw on the lower turnover plate 442 to repair or replace the half-height board 42, thus effects on the other half-height board 42 that works normally are effectively reduced when the half-height board 42 is being repaired or replaced.

In the electronic apparatus according to this embodiment, the turnover plate is used as the turnover positioning apparatus to conveniently implement functions of the turnover positioning apparatus; the screw is used as the lock-up apparatus to conveniently implement functions of the lock-up apparatus. Besides, by dividing the turnover plate to the upper turnover plate and the lower turnover plate, half-height boards in different heights are fixed respectively by using the upper turnover plate and the lower turnover plate, so that assembling of respective half-height boards are not affected, and reliability between the connections between half-height boards and the subrack is improved.

Based on the foregoing technical solution, optionally, an entry of an upper chute (not shown in the figure) on the subrack 41 according to this embodiment is a smooth chute with a horn-shape structure, and an entry of a lower chute (not shown in the figure) on the subrack 41 is a smooth chute with a horn-shape structure; an entry of an upper supporting chute (not shown in the figure) on the splitter plate main body 43 is a smooth chute with a horn-shape structure, and an entry of a lower supporting chute (not shown in the figure) on the splitter plate main body 43 is a smooth chute with a horn-shape structure.

Specifically, the electronic apparatus according to this embodiment uses the turnover positioning apparatus to fasten the half-height board 42 assembled to the subrack 41, and therefore, there is no need to add a barb at an entry of each chute. Besides, by setting the entries of the upper chute and the lower chute to a smooth chute with a horn-shape structure, and similarly, by setting the entries of the upper supporting chute and the lower supporting chute to a smooth chute with a horn-shape structure, users can easily insert the half-height boards 42 to the chutes when assembling the half-height boards 42 to the subrack 41.

In the electronic apparatus according to this embodiment, entries of upper chute and the lower chute on the subrack are set to smooth chutes with a horn-shape structure, and correspondingly, entries of the upper supporting chute and the lower supporting chute on the splitter plate main body are set to smooth chutes with a horn-shape structure, so that users can easily insert the half-height boards to the chutes, which makes the assembling process of the half-height boards easier.

Finally, it should be noted that the foregoing embodiments are only used to describe the technical solutions of the present invention, but are not intended to limit the technical solutions of the present invention. Although the present invention are described in detail with reference to the foregoing embodiments, those of ordinary skill in the art should understand that they may still make modifications to the technical solutions recorded in the foregoing embodiments, or make equivalent replacements to part of technical features of the technical solutions recorded in the foregoing embodiments; however, these modifications or replacements do not make corresponding technical solutions depart from the spirit and scope of the technical solutions of the embodiments of the present invention.

The invention claimed is:

1. A splitter plate, comprising:
 a splitter plate main body configured to be coupled to a subrack of an apparatus; and
 a turnover positioning apparatus comprising a hinge on a first side of the turnover positioning apparatus, wherein the turnover positioning apparatus is coupled to the splitter plate main body via the hinge on a side of the splitter plate main body, wherein the turnover positioning apparatus comprises a notch on a second side of the turnover positioning apparatus that is opposite the first side of the turnover positioning apparatus;
 wherein the turnover positioning apparatus is configured, after a half-height board is assembled to the subrack, to abut against the half-height board and connect to the subrack to fasten the half-height board to the subrack such that a portion of the half-height board protrudes from an edge of the turnover positioning apparatus through the notch.

2. The splitter plate according to claim 1, wherein the turnover positioning apparatus further comprises a lock-up apparatus, and the lock-up apparatus is set on the turnover positioning apparatus; the lock-up apparatus is configured to connect the turnover positioning apparatus to the subrack after the turnover positioning apparatus abuts against the half-height board.

3. The splitter plate according to claim 2, wherein: the turnover positioning apparatus is a turnover plate; the lock-up apparatus is a screw; the screw is installed in a through hole opened in the turnover plate and configured to connect to a threaded hole that is correspondingly set in the subrack.

4. The splitter plate according to claim 3, wherein: the turnover plate comprises an upper turnover plate comprising an upper through hole and a lower turnover plate comprising a lower through hole; a first side of the upper turnover plate and a first side of the lower turnover plate are respectively hinged on the side of the splitter plate main body; the upper through hole is installed with an upper screw, and the lower through hole is installed with a lower screw.

5. The splitter plate according to claim 1, wherein: the splitter plate main body is set with an upper supporting chute and a lower supporting chute, and an entry of the upper supporting chute is a smooth chute with a horn-shape structure; an entry of the lower supporting chute is a smooth chute with a horn-shape structure.

6. An electronic apparatus, comprising a subrack, a half-height board, and a splitter board; the splitter board comprises a splitter board main body, and the splitter board main body is set in the subrack; wherein, the splitter board further comprises a turnover positioning apparatus comprising a hinge on a first side of the turnover positioning apparatus, wherein the turnover positioning apparatus is coupled to the splitter board main body via the hinge on a side of the splitter board main body, wherein the turnover positioning apparatus comprises a notch on a second side of the turnover positioning apparatus that is opposite the first side of the turnover positioning apparatus; wherein the turnover positioning apparatus is configured, after the half-height board is assembled to the subrack, to abut against the half-height board and connect to the subrack to fasten the half-height board to the subrack such that a portion of the half-height board protrudes from an edge of the turnover positioning apparatus through the notch.

7. The electronic apparatus according to claim 6, wherein: the turnover positioning apparatus further comprises a lock-up apparatus, and the lock-up apparatus is set on the turnover positioning apparatus; the lock-up apparatus is configured to connect the turnover positioning apparatus to the subrack after the turnover positioning apparatus abuts against the half-height board.

8. The electronic apparatus according to claim 7, wherein: the turnover positioning apparatus is a turnover plate; the lock-up apparatus is a screw; the screw is installed in a through hole opened in the turnover plate and configured to connect to a threaded hole that is correspondingly set in the subrack.

9. The electronic apparatus according to claim 8, wherein: the turnover plate comprises an upper turnover plate comprising an upper through hole and a lower turnover plate comprising a lower through hole; a first side of the upper turnover plate and a first side of the lower turnover plate are respectively hinged on the side of the splitter board main body; the upper through hole is installed with an upper screw, and the lower through hole is installed with a lower screw.

10. The electronic apparatus according to claim 6, wherein: splitter board main body is set with an upper supporting chute and a lower supporting chute.

11. The electronic apparatus according to claim 10, wherein: an entry of the upper supporting chute is a smooth chute with a horn-shape structure, and an entry of the lower supporting chute is a smooth chute with a horn-shape structure.

12. The splitter plate according to claim 1, wherein the apparatus is based on a micro telecommunications computing architecture standard.

13. The electronic apparatus according to claim 6, wherein the electronic apparatus is based on a micro telecommunications computing architecture standard.

* * * * *